United States Patent
Louie et al.

(10) Patent No.: US 7,447,847 B2
(45) Date of Patent: Nov. 4, 2008

(54) MEMORY DEVICE TRIMS

(75) Inventors: Benjamin Louie, Fremont, CA (US); Aaron Yip, Santa Clara, CA (US); Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 568 days.

(21) Appl. No.: 10/894,242

(22) Filed: Jul. 19, 2004

(65) Prior Publication Data

US 2006/0015691 A1    Jan. 19, 2006

(51) Int. Cl.
G06F 12/00    (2006.01)
(52) U.S. Cl. .................... 711/154; 365/185.22
(58) Field of Classification Search .................. 711/154
See application file for complete search history.

(56) References Cited

U.S. PATENT DOCUMENTS

| | | | | |
|---|---|---|---|---|
| 5,615,159 A * | 3/1997 | Roohparvar | ............ | 365/185.07 |
| 5,627,784 A * | 5/1997 | Roohparvar | ............ | 365/189.01 |
| 5,801,985 A * | 9/1998 | Roohparvar et al. | ... | 365/185.01 |
| 5,802,598 A * | 9/1998 | Watt | ............ | 711/170 |
| 5,930,358 A * | 7/1999 | Rao | ............ | 713/193 |
| 6,163,225 A | 12/2000 | Sundaram | | |
| 6,263,399 B1 * | 7/2001 | Hwang | ............ | 711/103 |
| 6,269,027 B1 * | 7/2001 | Hurst et al. | ............ | 365/189.05 |
| 6,363,454 B1 * | 3/2002 | Lakhani et al. | ............ | 711/100 |
| 6,614,689 B2 * | 9/2003 | Roohparvar | ............ | 365/185.22 |
| 6,629,047 B1 | 9/2003 | Guliani | | |
| 6,740,984 B2 * | 5/2004 | Tay et al. | ............ | 257/780 |
| 6,977,410 B2 * | 12/2005 | Naso et al. | ............ | 257/316 |
| 2002/0144103 A1 * | 10/2002 | Kendall | ............ | 713/1 |
| 2003/0031056 A1 * | 2/2003 | Roohparvar | ............ | 365/185.22 |
| 2004/0246773 A1 * | 12/2004 | Naso et al. | ............ | 365/154 |
| 2005/0280072 A1 * | 12/2005 | Naso et al. | ............ | 257/314 |
| 2006/0256620 A1 * | 11/2006 | Nguyen et al. | ............ | 365/185.28 |

\* cited by examiner

*Primary Examiner*—Reginald G. Bragdon
*Assistant Examiner*—Larry T Mackall
(74) *Attorney, Agent, or Firm*—Leffert Jay & Polglaze, P.A.

(57) ABSTRACT

Methods and apparatus are provided. A memory device has a memory array, base trim circuitry adapted to store base control parameter values common to the memory array, and a reference trim circuit corresponding to a portion of the memory array. The reference trim circuit is adapted to store one or more reference control parameter values for respectively correcting one or more of the base control parameter values of the base trim circuitry for application to the portion of the memory array. The memory device may include an index circuit corresponding to the reference trim circuit. The index circuit is adapted to store one or more index parameter values for respectively selecting the one or more base control parameter values of the base trim circuitry for correction by the one or more reference control parameter values of the reference trim circuit.

68 Claims, 3 Drawing Sheets

MEMORY DEVICE TRIMS

TECHNICAL FIELD OF THE INVENTION

The present invention relates generally to memory devices and in particular the present invention relates to memory device trims.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Memory devices usually include trim circuits that are programmed to output bit values used to provide a variety of options for algorithms that control the operations of the memory device, such algorithm options may include timing, pulse counts, applied voltage levels, etc. The bit values are usually programmed once for a memory device and are rarely changed once the memory device has reached production. Moreover, the bit values are usually applied globally to an entire memory array, which can include thousands of memory blocks, especially for NAND devices. However, as memory array sizes increase, applying the bit values globally to an entire memory array may not be sufficient.

For the reasons stated above, and for other reasons stated below which will become apparent to those skilled in the art upon reading and understanding the present specification, there is a need in the art for alternative trimming methods.

SUMMARY

The above-mentioned problems with current trimming methods and other problems are addressed by the present invention and will be understood by reading and studying the following specification.

For one embodiment, the invention provides a memory device having a memory array, base trim circuitry adapted to store base control parameter values common to the memory array, and a reference trim circuit corresponding to a portion of the memory array. The reference trim circuit is adapted to store one or more reference control parameter values for respectively correcting one or more of the base control parameter values of the base trim circuitry for application to the portion of the memory array.

For another embodiment, the invention provides a memory device having a memory array, base trim circuitry adapted to store base control parameter values common to the memory array, and a reference trim circuit corresponding to a portion of the memory array. The reference trim circuit is adapted to store one or more reference control parameter values for respectively correcting one or more of the base control parameter values of the base trim circuitry for application to the portion of the memory array. The memory device also includes an index circuit corresponding to the reference trim circuit. The index circuit is adapted to store one or more index parameter values for respectively selecting the one or more base control parameter values of the base trim circuitry for correction by the one or more reference control parameter values of the reference trim circuit.

For another embodiment, the invention provides a method of operating a memory device, that includes correcting one or more base control parameter values corresponding to one or more memory blocks of a memory array of the memory device during normal operation, and controlling and/or accessing the one or more memory blocks using the corrected one or more base control parameter values.

For another embodiment, the invention provides a method of operating a memory device that includes reading global values for a first plurality of operating parameters for control and/or access of a memory array of the memory device. When controlling or accessing a first portion of the memory array, the method includes reading first local values for a second plurality of operating parameters for control and/or access of the memory array. When controlling or accessing a second portion of the memory array, the method includes reading second local values for the second plurality of operating parameters for control and/or access of the memory array.

For another embodiment, the invention provides a method of trimming a memory device, including testing the memory device to determine desired values for operating parameters for control and/or access of a memory array of the memory device; setting first trim values corresponding to desired values for a first subset of the operating parameters for control and/or access of the memory array; setting second trim values corresponding to desired values for a second subset of the operating parameters for control and/or access of a first portion of the memory array; and setting third trim values corresponding to desired values for the second set of operating parameters for control and/or access of a second portion of the memory array.

Further embodiments of the invention include methods and apparatus of varying scope.

DETAILED DESCRIPTION

Figure 1:
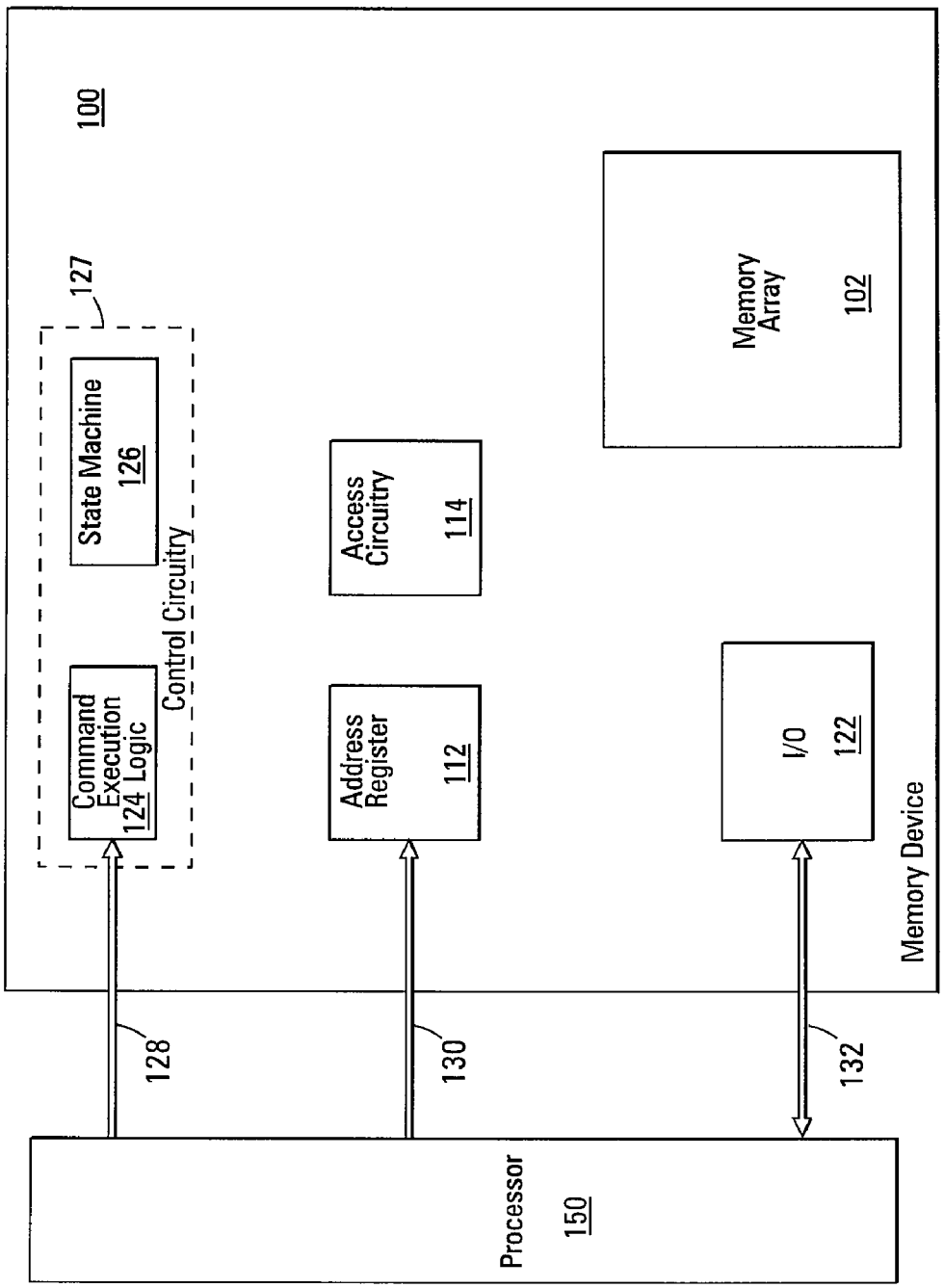
FIG. 1 is a block diagram illustration of memory system, according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustration of a memory system, according to an embodiment of the present invention. The memory system includes a memory device 100, such as a flash memory device, e.g., NAND or NOR flash. Memory device 100 includes a memory array 102 having a plurality of memory cells arranged in row and column fashion. For one embodiment, each of the memory cells includes a floating-gate field-effect transistor capable of holding a charge for the non-volatile storage of data. Each of the cells can be electrically programmed on an individual basis by charging the floating gate.

The rows of memory array 102 are arranged in blocks, where a memory block is some discrete portion of the memory array 102. Individual word lines generally extend to only one memory block, while bit lines may extend to multiple memory blocks. The memory cells generally can be erased in blocks. Data, however, may be stored in the memory array 102 separate from the block structure.

For one embodiment, memory array 102 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as row access circuitry of access circuitry 114 of memory device 100, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 102 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as row of access circuitry 114 of memory device 100, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Memory array 102 can be accessed using externally provided location addresses received by an address register 112 via address signal connections 130. The address signals are decoded, and one or more target memory cells are selected in response to the decoded address signals, using the access circuitry 114 that includes decode and select circuitry.

Data is input and output through an I/O circuit 122 via data connections 132. I/O circuit 122 includes data output registers, output drivers and output buffers. Command execution logic 124 is provided to control the basic operations of the memory device 100 in response to control signals received via control signal connections 128. A state machine 126 may also be provided to control specific operations performed on the memory array and the memory cells. The command execution logic 124 and/or state machine 126 can be generally referred to as control circuitry 127 to control read, write, erase and other memory operations. The control circuitry 127 is adapted to facilitate the methods of the various embodiments. The data connections 132 are typically used for bi-directional data communication. The memory can be coupled to an external processor 150 for operation. An example of a processor 150 includes a memory controller in a personal computer.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

Figure 2:
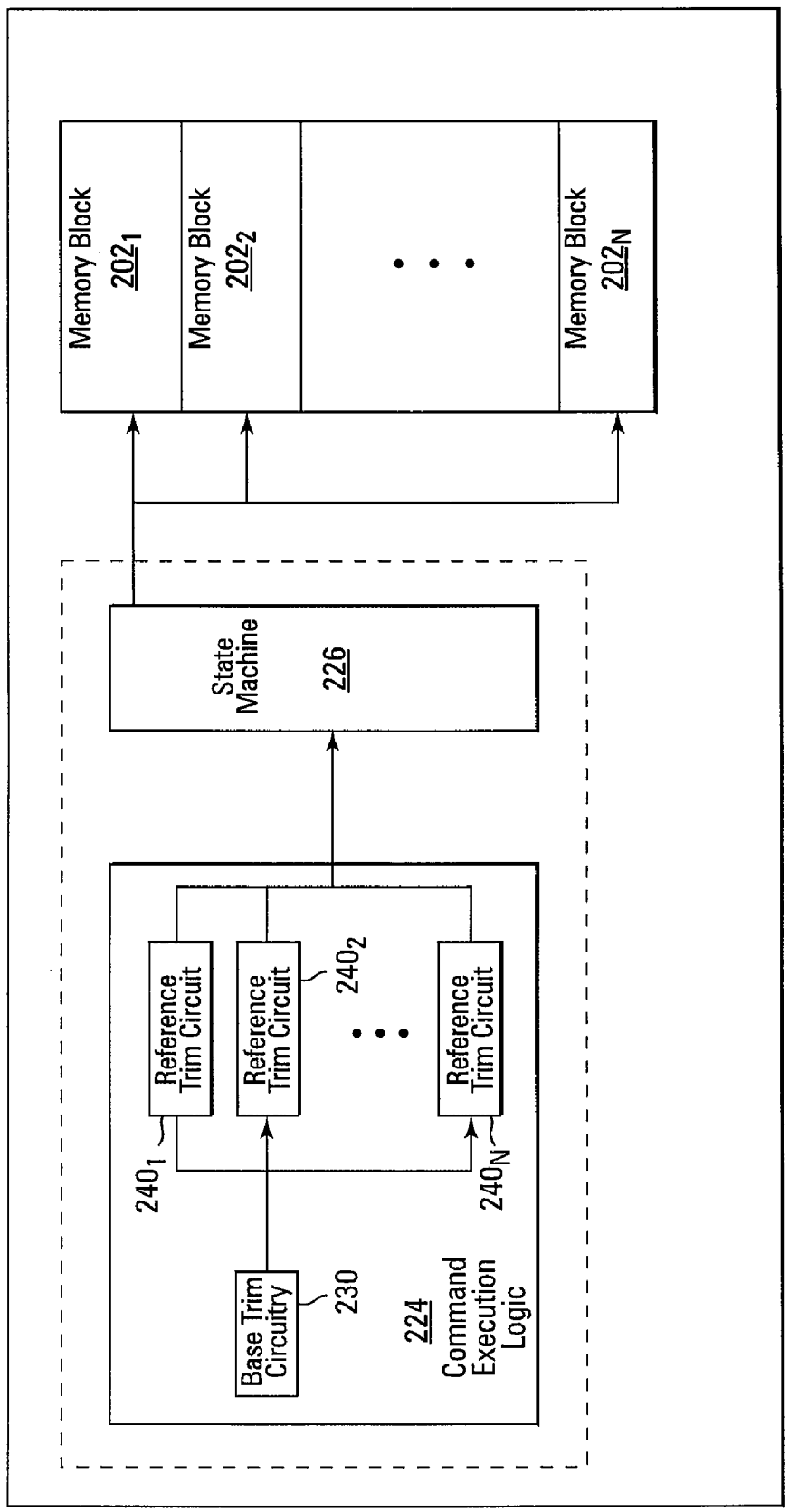
FIG. 2 is a block diagram of a portion of a memory device, according to another embodiment of the present invention.

FIG. 2 is a block diagram of a portion of a memory device, such as the memory device 100 of FIG. 1, according to another embodiment of the present invention. For example, the memory array 102 of memory device 100 may include memory blocks $202_1$ to $202_N$, shown in FIG. 2, and the control circuitry 127 of memory device 100 may include a state machine 226 that in one embodiment, includes high-voltage generation circuitry, and command execution logic 224, shown in FIG. 2. For one embodiment, command execution logic 224 includes base (or global) trim circuitry 230 coupled to reference (or local) trim circuits $240_1$ to $240_N$ that respectively correspond to memory blocks $202_1$ to $202_N$. Reference trim circuits 240 are coupled to state machine 226 that is, in turn, coupled to each of the memory blocks 202.

Base trim circuitry 230 may include fusible elements, such as fuses and/or anti-fuses, and/or other non-volatile storage elements adapted to store base (or global) control parameter values (or base bit or base trim values) common to each of memory blocks 202 and used by state machine 226 for controlling operations on memory blocks 202. Such base control parameters may include, for example, parameters for adjusting the magnitude and duration of voltage pulses applied to memory blocks 202, or portions thereof, for carrying out programming and erasing operations. Reference (or local) trim circuits 240 may also include non-volatile storage elements adapted to store reference (or local) control parameter values (or reference bit or reference trim values) for correcting, e.g., modifying (adjusting up or down), replacing, or supplementing, the base control parameter values. For some embodiments, the reference control parameter values correspond to a magnitude and a direction of the correction applied to the base control parameter values.

In operation, state machine 226 respectively corrects one or more base control parameter values according to one or more reference control parameter values of a trim circuit 240 (e.g., trim circuit $240_1$) and controls and/or accesses the memory block (e.g., memory block $202_1$), via access circuitry of the memory device, corresponding to that trim circuit 240 based on the one or more corrected base control parameter values. Specifically, state machine 226 receives one or more reference control parameter values from one or more of trim circuits 240, receives base control parameter values from base trim circuitry 230, corrects one or more of the base control parameter values according to one or more corresponding reference control parameter values from each of the one or more trim circuits 240, and sets the access circuitry, such as access circuitry 114, according to the corrected base control parameter values to control and/or access the memory blocks respectively corresponding to the one or more trim circuits 240.

For one embodiment, access circuitry 114 is used to control the magnitude and/or duration of voltage pulses of various memory voltages in response to the base control parameter values stored in base trim circuitry 230 and/or the control parameter values stored in base trim circuitry 230 as corrected by the reference control parameter values stored in the reference trim circuits 240. These include, for example, the voltage pulse applied to the array word lines during program operations, to the array word lines during heal operations, and to the source lines of array blocks during erase operations.

More specifically, for one embodiment, access circuitry 114 may have a trim multiplexer that is controlled by the control parameter values stored in base trim circuitry 230 and/or the control parameter values stored in base trim circuitry 230 as corrected by the reference control parameter values stored in the reference trim circuits 240. The multiplexer, in turn, activates transistors (e.g., N-channel transistors) that are respectively connected to a voltage supply. Each activated transistor enables its respective voltage supply to be applied to the memory blocks respectively corresponding to the one or more trim circuits 240, for example.

For other embodiments, one reference trim circuit 240 corresponds to a group of memory blocks 202 instead of a corresponding one of memory blocks 202. For this embodiment, the reference control parameter values of that reference trim circuit 240 are used to modify base control parameter values for the corresponding group of memory blocks. For one embodiment, one of the reference trim circuits 240 corresponds to some portion of one of the memory blocks 202, e.g., an individual word line of one of memory blocks 202. For this embodiment, the reference control parameter values of that reference trim circuit 240 are used to correct base control parameter values for the corresponding word line or word lines.

For other embodiments, base trim circuitry 230 includes base control parameter values that are common to each of memory blocks 202, and each of the local trim circuits 240 includes local control parameter values that are common to a respective one of memory blocks 202. For these embodiments, access circuitry 114 controls the base memory operations of each the memory blocks 202 in response to the base control parameter values and controls operations specific to specific memory blocks 202 in response to the local control parameter values of the respective local trim circuits 240.

Figure 3:
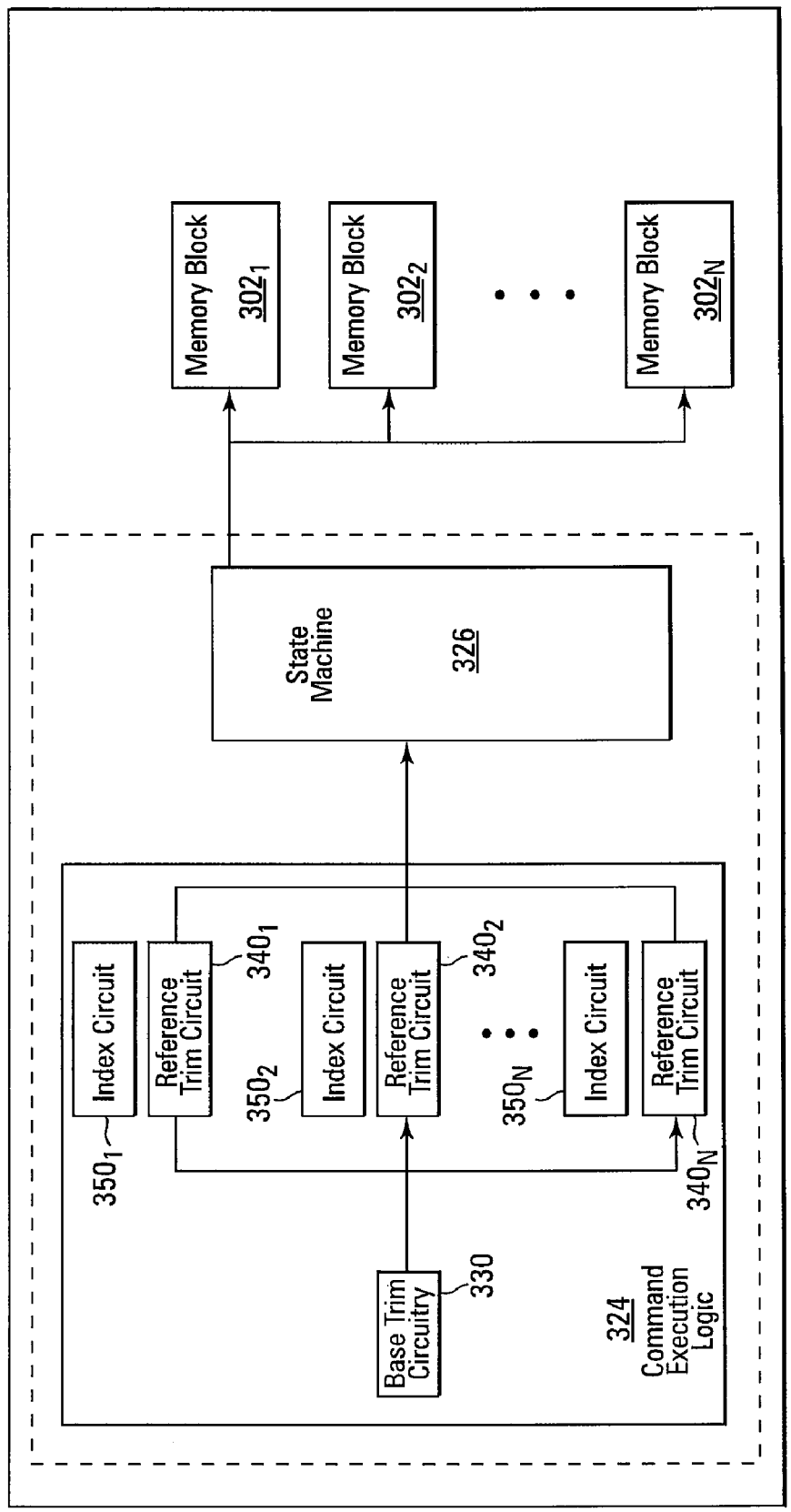
FIG. 3 is a block diagram of a portion of a memory device, according to another embodiment of the present invention.

FIG. 3 is a block diagram of a portion of a memory device, such as the memory device 100 of FIG. 1, according to another embodiment of the present invention. For example, the memory array 102 of memory device 100 may include memory blocks $302_1$ to $302_N$, shown in FIG. 3, and the control circuitry 127 of memory device 100 may include a state machine 326 that in one embodiment, includes high-voltage generation circuitry, and command execution logic 324, shown in FIG. 3. For one embodiment, command execution logic 324 includes base (or global) trim circuitry 330 coupled to reference (or local) trim circuits $340_1$ to $340_N$ that respectively correspond to memory blocks $302_1$ to $302_N$. Reference trim circuits 340 are coupled to state machine 326 that is, in turn, coupled to each of the memory blocks 302. Reference trim circuits $340_1$ to $340_N$ respectively correspond to programmable local index circuits $350_1$ to $350_N$.

Base trim circuitry 330 may include non-volatile storage elements adapted to store base control parameter values (or base trim values) used by state machine 326 for controlling the memory operations. Reference (or local) trim circuits 340 may also include non-volatile storage elements adapted to store reference control parameter values (or reference trim values) for correcting the base control parameter values. Index circuits 350 may include non-volatile storage elements adapted to store index parameter values (or index bit values) for selecting base control parameter values from base trim circuitry 330 to be modified corrected by the reference control parameter values of trim circuits 340 respectively corresponding to the index circuits 350.

In operation, state machine 326 receives an index parameter value from an index circuit 350 (e.g., index circuit $350_1$), a plurality of base control parameter values from base trim circuitry 330, and a reference control parameter value from a trim circuit 340 (e.g., reference trim circuit $340_1$) respectively corresponding to the index circuit 350 that provided the index parameter value. State machine 326 selects a base control parameter value from the plurality of base control parameter values, according to the index parameter value, for correction by the reference control parameter value of the reference trim circuit 340 (e.g., reference trim circuit $340_1$) corresponding to the index circuit 350 (e.g., index circuit $350_1$) that provided that index parameter value. State machine 326 corrects the selected base control parameter value according to that reference control parameter value. State machine 326 then sets the access circuitry, such as access circuitry 114, according to the corrected base control parameter value to control and/or access the memory block (e.g., memory block $302_1$) corresponding to the reference trim circuit 340 containing the reference control parameter value used to correct the base control parameter value.

For other embodiments, one reference trim circuit 340 and its corresponding index circuit 350 correspond to a group of memory blocks 302 instead of one of memory blocks 302. For this embodiment, the index parameter values of that index circuit 350 are used to select the base control parameter values for the corresponding group of memory blocks to be modified by the reference control parameter values of the corresponding reference trim circuit 340. For one embodiment, one reference trim circuit 340 and its corresponding index circuit 350 correspond to some portion of one of the memory blocks 302, e.g., an individual word line of one of memory blocks 302. For this embodiment, the index parameter values of that index circuit 350 are used to select the base control parameter values for the corresponding word line or word lines to be modified by the reference control parameter values of the corresponding reference trim circuit 340.

For various embodiments, base trim circuitry 230 or 330, reference trim circuits 240 or 340, and index circuits 350 are programmed in response to testing a memory device, such as memory device 100, to determine desired values for operating parameters for control and/or access of a memory array, such as memory array 102, of the memory device.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
   a memory array;
   base trim circuitry adapted to store base control parameter values common to at least mutually exclusive first and second portions of the memory array;
   a first reference trim circuit corresponding to the first portion of the memory array, the first reference trim circuit adapted to store one or more first reference control parameter values;
   a second reference trim circuit corresponding to the second portion of the memory array, the second reference trim circuit adapted to store one or more second reference control parameter values; and
   a state machine adapted to receive the base control parameter values from the base trim circuitry and the one or more first reference control parameters from the first reference trim circuit and adapted to correct the base control parameter values, using the one or more first reference control parameters, for application to the first portion of the memory array, the state machine adapted to receive the one or more second reference control parameters from the second reference trim circuit and adapted to correct the base control parameter values, using the one or more second reference control parameters, for application to the second portion of the memory array;
   wherein the base control parameter values corrected using the one or more first reference control parameters for application to the first portion of the memory array are the same as the base control parameter values corrected using the one or more second reference control parameters for application to the second portion of the memory array.

2. The memory device of claim 1, wherein the first portion corresponds to one or more first word lines of the memory array and the second portion corresponds to one or more second word lines of the memory array.

3. The memory device of claim 1, wherein the memory array comprises a plurality of memory cells arranged in rows and columns, and wherein each portion of the memory array corresponds to one or more rows of the memory cells.

4. The memory device of claim 1, wherein the memory array comprises a plurality of memory blocks and each portion corresponds to one or more blocks of the memory array.

5. The memory device of claim 1, wherein the memory array is a NAND memory array.

6. The memory device of claim 1, wherein the base trim circuitry and the first and second reference trim circuits each comprise non-volatile storage elements.

7. The memory device of claim 1, wherein the correction of the base control parameter values comprises modifying, replacing, or supplementing the one or more base control parameter values.

8. A memory device comprising:
   a memory array;
   base trim circuitry adapted to store base control parameter values common to the memory array;
   a first reference trim circuit corresponding to a first portion of the memory array, the first reference trim circuit adapted to store one or more first reference control parameter values for respectively correcting one or more of the base control parameter values of the base trim circuitry for application to the first portion of the memory array; and
   a first index circuit corresponding to the first reference trim circuit, the first index circuit adapted to store one or more first index parameter values for respectively selecting the one or more base control parameter values of the base trim circuitry for correction by the one or more first reference control parameter values of the first reference trim circuit.

9. The memory device of claim 8, further comprising a state machine for controlling operations on the memory array.

10. The memory device of claim 8, further comprising a second reference trim circuit corresponding to a word line of a second portion of the memory array and adapted to store one or more second reference control parameter values for respectively correcting one or more of the base control parameter values of the base trim circuitry for application to the word line.

11. The memory device of claim 10, further comprising a second index circuit corresponding to the second reference trim circuit and adapted to store one or more second index parameter values for respectively selecting the one or more of the base control parameter values of the base trim circuitry for modification by the one or more second reference control parameter values of the second reference trim circuit.

12. The memory device of claim 8, further comprising a second reference trim circuit corresponding to a second portion of the memory array, the second reference trim circuit adapted to store one or more second reference control parameter values for respectively correcting one or more of the base control parameter values of the base trim circuitry for application to the second portion of the memory array.

13. The memory device of claim 12, further comprising a second index circuit corresponding to the second reference trim circuit and adapted to store one or more second index parameter values for respectively selecting the one or more of the base control parameter values of the base trim circuitry for correction by the one or more second reference control parameter values of the second reference trim circuit.

14. The memory device of claim 13, wherein the memory array comprises a plurality of memory cells arranged in rows and columns, and wherein each portion of the memory array corresponds to one or more rows of the memory cells.

15. The memory device of claim 13, wherein the memory array comprises a plurality of memory blocks and each portion corresponds to one or more blocks of the memory array.

16. The memory device of claim 8, wherein the memory array is a NAND memory array.

17. The memory device of claim 8, wherein the base trim circuitry, the first reference trim circuit, and the first index circuit each comprise non-volatile storage elements.

18. A memory device comprising:
a memory array comprising a plurality of memory blocks;
a state machine;
base trim circuitry adapted to store base control parameter values common to the memory array, the base control parameter values for use by the state machine for controlling operations on the memory array;
a plurality of reference trim circuits, each of the reference trim circuits respectively corresponding to each of the memory blocks, each of the reference trim circuits adapted to store one or more reference control parameter values for respectively correcting one or more of the base control parameter values of the base trim circuitry for use by the state machine for controlling operations on the corresponding one of the memory blocks; and
a plurality of index circuits, each of the index circuits respectively corresponding to each of the reference trim circuits, each of the index circuits adapted to store one or more index parameter values for respectively selecting the one or more base control parameter values of the base trim circuitry for correction by the one or more reference control parameter values of the corresponding one of the reference trim circuits.

19. A memory system comprising:
a processor; and
a memory device coupled to the processor, the memory device comprising:
a memory array;
base trim circuitry adapted to store base control parameter values common to at least mutually exclusive first and second portions of the memory array;
a first reference trim circuit corresponding to the first portion of the memory array, the first reference trim circuit adapted to store one or more first reference control parameter values;
a second reference trim circuit corresponding to the second portion of the memory array, the second reference trim circuit adapted to store one or more second reference control parameter values; and
a state machine adapted to receive the base control parameter values from the base trim circuitry and the one or more first reference control parameters from the first reference trim circuit and adapted to correct the base control parameter values, using the one or more first reference control parameters, for application to the first portion of the memory array, the state machine adapted to receive the one or more second reference control parameters from the second reference trim circuit and adapted to correct the base control parameter values, using the one or more second reference control parameters, for application to the second portion of the memory array;
wherein the base control parameter values corrected using the one or more first reference control parameters for application to the first portion of the memory array are the same as the base control parameter values corrected using the one or more second reference control parameters for application to the second portion of the memory array.

20. A memory system comprising:
a processor; and
a memory device coupled to the processor, the memory device comprising:
a memory array;
base trim circuitry adapted to store base control parameter values common to the memory array;
a first reference trim circuit corresponding to a first portion of the memory array, the first reference trim circuit adapted to store one or more first reference control parameter values for respectively correcting one or more of the base control parameter values of the base trim circuitry for application to the first portion of the memory array; and
a first index circuit corresponding to the first reference trim circuit, the first index circuit adapted to store one or more first index parameter values for respectively selecting the one or more base control parameter values of the base trim circuitry for modification by the one or more first reference control parameter values of the first reference trim circuit.

21. The memory system of claim 20, further comprising a second reference trim circuit corresponding to a word line of a second memory portion of the memory array and adapted to store one or more second reference control parameter values for respectively correcting one or more of the base control parameter values of the base trim circuitry for application to the word line.

22. The memory system of claim 21, further comprising a second index circuit corresponding to the second reference trim circuit and adapted to store one or more second index parameter values for respectively selecting the one or more of the base control parameter values of the base trim circuitry for correction by the one or more second reference control parameter values of the second reference trim circuit.

23. The memory system of claim 20, further comprising a second reference trim circuit corresponding to a second memory portion of the memory array, the second reference trim circuit adapted to store one or more second reference control parameter values for respectively modifying one or more of the base control parameter values of the base trim circuitry for application to the second memory portion.

24. The memory system of claim 23, further comprising a second index circuit corresponding to the second reference trim circuit and adapted to store one or more second index parameter values for respectively selecting the one or more of the base control parameter values of the base trim circuitry for correction by the one or more second reference control parameter values of the second reference trim circuit.

25. A memory system comprising:
a processor; and
a memory device coupled to the processor, the memory device comprising:

a memory array comprising a plurality of memory blocks;
a state machine;
base trim circuitry adapted to store base control parameter values common to the memory array, the base control parameter values for use by the state machine for controlling operations on the memory array;
a plurality of reference trim circuits, each of the reference trim circuits respectively corresponding to each of the memory blocks, each of the reference trim circuits adapted to store one or more reference control parameter values for respectively correcting one or more of the base control parameter values of the base trim circuitry for use by the state machine for controlling operations on the corresponding one of the memory blocks; and
a plurality of index circuits, each of the index circuits respectively corresponding to each of the reference trim circuits, each of the index circuits adapted to store one or more index parameter values for respectively selecting the one or more base control parameter values of the base trim circuitry for correction by the one or more reference control parameter values of the corresponding one of the reference trim circuits.

26. The memory system of claim 25, wherein the memory device is a NAND memory device.

27. A memory system comprising:
a processor; and
a memory device coupled to the processor, the memory device comprising:
a memory array comprising a plurality of memory blocks;
control circuitry;
base trim circuitry adapted to store base control parameter values common to the memory array, the base control parameter values for use by the control circuitry for controlling operations on the memory array;
a plurality of reference trim circuits, each of the reference trim circuits respectively corresponding to each of the memory blocks, each of the reference trim circuits adapted to store one or more reference control parameter values for respectively correcting one or more of the base control parameter values of the base trim circuitry for use by the control circuitry for controlling operations on the corresponding one of the memory blocks; and
a plurality of index circuits, each of the index circuits respectively corresponding to each of the reference trim circuits, each of the index circuits adapted to store one or more index parameter values for respectively selecting the one or more base control parameter values of the base trim circuitry for modification by the one or more reference control parameter values of the corresponding one of the reference trim circuits.

28. The memory system of claim 27, wherein the memory device is a NAND memory device.

29. A memory device, comprising:
a memory array;
a global trim circuit for storing base control parameter values common to at least mutually exclusive first and second portions of the memory array for control and/or access of the first and second portions of the memory array; and
at least first and second local trim circuits, each for storing local corrections to a subset of the base control parameter values, the subset having at least one of the base control parameter values, wherein the first local trim circuit corresponds only to the first portion of the memory array and the second local trim circuit corresponds only to the second portion of the memory array, wherein the local corrections of the first local trim circuit are for correcting the subset of the base control parameter values for control and/or access of only the first portion of the memory array and the local corrections of the second local trim circuit are for correcting the subset of the base control parameter values for control and/or access of only the second portion of the memory array;
wherein the subset of the base control parameter values corrected using the local corrections of the first local trim circuit for control and/or access of only the first portion of the memory array is the same as the subset of the base control parameter values corrected using the local corrections of the second local trim circuit for control and/or access of only the second portion of the memory array.

30. The memory device of claim 29, wherein the memory array comprises a plurality of memory blocks and each portion corresponds to one or more blocks of the memory array.

31. A memory device, comprising:
a memory array;
a global trim circuit for storing base control parameter values common to the memory array;
a plurality of index circuits for storing index parameter values indicative of a subset of the base control parameter values, each index circuit corresponding to a portion of the memory array;
a plurality of local trim circuits for storing local corrections to the subset of the base control parameter values for a corresponding index circuit, wherein each local trim circuit corresponds to a portion of the memory array and wherein its local corrections are common to its corresponding portion of the memory array.

32. The memory device of claim 31, wherein the memory array comprises a plurality of memory blocks and each portion corresponds to one or more blocks of the memory array.

33. The memory device of claim 31, wherein the memory array comprises a plurality of memory cells arranged in rows and columns, and wherein each portion of the memory array corresponds to one or more rows of the memory cells.

34. The memory device of claim 31, wherein the global trim circuit, the local trim circuits, and the index circuits each comprise non-volatile storage elements.

35. The memory device of claim 31, wherein the base control parameter values are used for control and/or access of the memory array.

36. A memory device, comprising:
a memory array;
a state machine;
a global trim circuit for storing base control parameter values common to at least first and second portions of the memory array; and
at least first and second local trim circuits, each for storing local corrections to a subset of the base control parameter values, the subset having at least one of the base control parameter values, wherein the first local trim circuit corresponds only to the first portion of the memory array and the second local trim circuit corresponds only to the second portion of the memory array;
wherein the state machine is adapted to receive the subset of the base control parameter values and the local corrections of the first and second local trim circuits;
wherein the state machine is adapted to create first corrected base control parameter values at the state machine by applying, at the state machine, the local corrections of the first local trim circuit received at the state machine to the subset of the base control parameter values received at the state machine, the first corrected base control parameter values for control and/or access of only the first portion of the memory array; and wherein the state machine is adapted to create second corrected base control parameter values at the state machine by applying, at the state machine, the local corrections of the second local trim circuit received at the state machine to the subset of the base control parameter values received at the state machine, the second corrected base control parameter values for control and/or access of only the second portion of the memory array.

37. A memory system comprising:
a processor; and
a memory device coupled to the processor, the memory device comprising:
   a memory array;
   a global trim circuit for storing base control parameter values common to at least mutually exclusive first and second portions of the memory array for control and/or access of the first and second portions of the memory array; and
   at least first and second local trim circuits, each for storing local corrections to a subset of the base control parameter values, the subset having at least one of the base control parameter values, wherein the first local trim circuit corresponds only to the first portion of the memory array and the second local trim circuit corresponds only to the second portion of the memory array, wherein the local corrections of the first local trim circuit are for correcting the subset of the base control parameter values for control and/or access of only the first portion of the memory array and the local corrections of the second local trim circuit are for correcting the subset of the base control parameter values for control and/or access of only the second portion of the memory array;
   wherein the subset of the base control parameter values corrected using the local corrections of the first local trim circuit for control and/or access of only the first portion of the memory array are the same as the subset of the base control parameter values corrected using the local corrections of the second local trim circuit for control and/or access of only the second portion of the memory array.

38. A memory system comprising:
a processor; and
a memory device coupled to the processor, the memory device comprising:
   a memory array;
   a state machine;
   a global trim circuit for storing base control parameter values common to at least first and second portions of the memory array; and
   at least first and second local trim circuits, each for storing local corrections to a subset of the base control parameter values, the subset having at least one of the base control parameter values, wherein the first local trim circuit corresponds only to the first portion of the memory array and the second local trim circuit corresponds only to the second portion of the memory array;
   wherein the state machine is adapted to receive the subset of the base control parameter values and the local corrections of the first and second local trim circuits;
   wherein the state machine is adapted to create first corrected base control parameter values at the state machine by applying, at the state machine, the local corrections of the first local trim circuit received at the state machine to the subset of the base control parameter values received at the state machine, the first corrected base control parameter values for control and/or access of only the first portion of the memory array; and
   wherein the state machine is adapted to create second corrected base control parameter values at the state machine by applying, at the state machine, the local corrections of the second local trim circuit received at the state machine to the subset of the base control parameter values received at the state machine, the second corrected base control parameter values for control and/or access of only the second portion of the memory array.

39. A method of operating a memory device, comprising:
receiving base control parameter values at a state machine of the memory device from base trim circuitry of the memory device, wherein the base control parameter values are common to at least first and second memory blocks of a memory array of the memory device;
receiving first reference control parameter values for the first memory block of the memory array at the state machine from a first reference trim circuit of the memory device that corresponds to the first memory block of the memory array;
receiving second reference control parameter values for the second memory block of the memory array at the state machine from a second reference trim circuit of the memory device that corresponds to the second memory block of the memory array;
creating first corrected base control parameter values at the state machine by correcting, at the state machine, the base control parameter values received at the state machine from the base trim circuitry according to the first reference control parameter values received at the state machine;
creating second corrected base control parameter values at the state machine by correcting, at the state machine, the base control parameter values received at the state machine from the base trim circuitry according to the second reference control parameter values received at the state machine;
controlling and/or accessing the first memory block according to the first corrected base control parameter values using the state machine; and
controlling and/or accessing the second memory block according to the second corrected base control parameter values using the state machine.

40. The method of claim 39, wherein correcting the base control parameter values comprises modifying, replacing, or supplementing the base control parameter values.

41. The method of claim 40, wherein the base control parameter values are programmed in the base trim circuitry, the first reference control parameter values are programmed in the first reference trim circuit, and the second reference control parameter values are programmed in the second reference trim circuit.

42. A method of operating a memory device, comprising:
selecting one or more base control parameter values corresponding to one or more memory blocks of a memory array of the memory device for correction;
correcting the one or more base control parameter values during normal operation; and controlling memory operations on the one or more memory blocks using the corrected one or more base control parameter values;

wherein selecting the one or more base control parameter values comprises selecting the one or more base control parameter values according to index parameter values respectively corresponding to the one or more base control parameter values.

43. The method of claim 42, wherein correcting the one or more base control parameter values comprises modifying, replacing, or supplementing the one or more base control parameter values according to one or more reference control parameter values respectively corresponding to the one or more base control parameter values.

44. The method of claim 43, wherein the one or more base control parameter values are programmed in base trim circuitry of the memory device, the one or more reference control parameter values are programmed in a reference trim circuit of the memory device corresponding to the one or more memory blocks, and the one or more index parameter values are programmed into an index circuit of the memory device corresponding to the reference trim circuit.

45. A method of operating a memory device, comprising:
receiving a plurality of base control parameter values at a state machine of the memory device from base trim circuitry of the memory device;
receiving a reference control parameter value at the state machine from a reference trim circuit of the memory device that corresponds to a memory block of a memory array of the memory device;
receiving an index parameter value at the state machine from an index circuit of the memory device that corresponds to the reference trim circuit;
selecting a base control parameter value from the plurality of base control parameter values according to the index parameter value at the state machine;
correcting the selected base control parameter value according to the reference control parameter value at the state machine; and
controlling and/or accessing the memory block according to the corrected base control parameter value using the state machine.

46. A method of operating a memory device, comprising:
reading, into a state machine, global values for a plurality of operating parameters for control and/or access of a memory array of the memory device;
applying the global values for a first subset of the operating parameters when controlling or accessing a portion of the memory array, the first subset having at least one operating parameter;
creating, at the state machine, from the read global values, corrected global values for the remaining subset of the operating parameters by applying, at the state machine, a local correction to the read global values for a remaining subset of the operating parameters, the remaining subset having at least one operating parameter; and
applying the corrected global values for the remaining subset of the operating parameters when controlling or accessing the portion of the memory array.

47. The method of claim 46, wherein applying a local correction to the global values comprises reading the local correction from a local trim circuit of the memory device corresponding to the portion of the memory array.

48. The method of claim 46, wherein reading global values comprises reading the global values from a global trim circuit of the memory device.

49. A method of operating a memory device, comprising:
reading global values for a plurality of operating parameters for control and/or access of a memory array of the memory device;
applying the global values for a first subset of the operating parameters when controlling or accessing a portion of the memory array;
selecting a local correction according to a value of an index parameter; and
applying the local correction to the global values for a remaining subset of the operating parameters when controlling or accessing the portion of the memory array.

50. The method of claim 49, further comprising reading the value of the index parameter from an index circuit of the memory device.

51. A method of operating a memory device, comprising:
reading global values for a first plurality of operating parameters for control and/or access of at least mutually exclusive first and second portions of a memory array of the memory device;
when controlling or accessing the first portion of the memory array, reading first local values for a second plurality of operating parameters, mutually exclusive of the first plurality of operating parameters, for control and/or access of only the first portion of the memory array; and
when controlling or accessing the second portion of the memory array, reading second local values for the second plurality of operating parameters, mutually exclusive of the first plurality of operating parameters, for control and/or access of only the second portion of the memory array.

52. The method of claim 51, wherein reading first local values for a second plurality of operating parameters comprises reading the first local values from a first local trim circuit of the memory device corresponding to the first portion of the memory array.

53. The method of claim 52, wherein reading second local values for the second plurality of operating parameters comprises reading the second local values from a second local trim circuit of the memory device corresponding to the second portion of the memory array.

54. The method of claim 53, wherein reading global values comprises reading the global values from a global trim circuit of the memory device.

55. A method of operating a memory device, comprising:
reading global values for a plurality of operating parameters for control and/or access of a memory array of the memory device;
reading index values corresponding to a subset of the operating parameters, the subset of the operating parameters corresponding to a portion of the memory array;
reading local corrections corresponding to the subset of the operating parameters corresponding to the portion of the memory array;
applying the local corrections to the global values for the subset of the operating parameters; and
using the corrected values of the operating parameters for controlling and/or accessing the portion of the memory array.

56. The method of claim 55, wherein reading local corrections further comprises reading a local correction for each operating parameter of the subset of operating parameters.

57. A method of trimming a memory device, comprising:
testing the memory device to determine desired values for operating parameters for control and/or access of a memory array of the memory device;

setting first trim values corresponding to desired values for a first subset of the operating parameters for control and/or access of at least mutually exclusive first and second portions of the memory array, the first subset having at least one operating parameter;

setting second trim values corresponding to desired values for a second subset of the operating parameters for control and/or access of only the first portion of the memory array, the second subset having at least one operating parameter; and setting third trim values corresponding to desired values for a third subset of operating parameters for control and/or access of only the second portion of the memory array, the third subset having at least one operating parameter;

wherein the first and second subsets are mutually exclusive; and wherein the first and third subsets of operating parameters are mutually exclusive.

58. A method of trimming a memory device, comprising:

testing the memory device to determine desired values for operating parameters for control and/or access of a memory array of the memory device;

setting first trim values corresponding to desired values for a first subset of the operating parameters, the first subset containing at least one operating parameter;

setting second trim values corresponding to desired values for a remaining subset of the operating parameters that is mutually exclusive of the first subset of operating parameters, the remaining subset containing at least one operating parameter;

wherein setting second trim values occurs for at least first and second mutually exclusive subdivisions of the memory array; and wherein setting first trim values occurs only the first subdivision of the memory array.

59. The method of claim 58, wherein each subdivision of the memory array is selected from the group consisting of: one row of the memory array, a plurality of rows of the memory array, a block of the memory array and a plurality of blocks of the memory array.

60. The method of claim 58, wherein each subdivision of the memory array is the same size.

61. A method of trimming a memory device, comprising:

testing the memory device to determine global values for operating parameters for control and/or access of a memory array of the memory device;

selecting a subset of the operating parameters for applying a local correction to the global value;

setting index values corresponding to an indication of which operating parameters are included in the subset of the operating parameters;

selecting a plurality of subdivisions of the memory array where the local corrections are to be applied;

setting first trim values corresponding to the global values for the operating parameters; and setting second trim values corresponding to the local corrections for the operating parameters, wherein a set of second trim values is set for each of the subdivisions of the memory array.

62. The method of claim 61, wherein selecting a subset of the operating parameters for applying a local correction to the global value occurs for each of the subdivisions of the memory array.

63. The method of claim 62, wherein a first subset of the operating parameters for a first subdivision of the memory array includes at least one operating parameter not included in a second subset of the operating parameters for a second subdivision of the memory array.

64. The method of claim 61, wherein the second trim values correspond to a magnitude and a direction of the local correction to the global value.

65. The method of claim 61, wherein local corrections correspond to replacement values for the global values.

66. A method of trimming a memory device, comprising:

testing the memory device to determine global values for operating parameters for control and/or access of a memory array of the memory device;

selecting a plurality of subdivisions of the memory array, wherein it is desired to apply a local correction to one or more of the global values for the operating parameters for at least one of the subdivisions;

for each of the subdivisions of the memory array, selecting a subset of the operating parameters for applying a local correction to the global values;

setting index values corresponding to an indication of which operating parameters are included in the subset of the operating parameters for each of the subdivisions of the memory array;

setting first trim values corresponding to the global values for the operating parameters; and setting second trim values corresponding to the local corrections for the operating parameters, wherein a set of second trim values is set for each of the subdivisions of the memory array.

67. The method of claim 66, wherein selecting a subset of the operating parameters for applying a local correction to the global values further comprises selecting a null subset for at least one of the subdivisions.

68. The method of claim 66, wherein selecting a subset of the operating parameters for applying a local correction to the global values further comprises selecting the same subset for each of the subdivisions.

* * * * *

UNITED STATES PATENT AND TRADEMARK OFFICE
CERTIFICATE OF CORRECTION

PATENT NO. : 7,447,847 B2
APPLICATION NO. : 10/894242
DATED : November 4, 2008
INVENTOR(S) : Louie et al.

Page 1 of 1

It is certified that error appears in the above-identified patent and that said Letters Patent is hereby corrected as shown below:

In column 17, line 35, in Claim 58, after "only" insert -- for --.

Signed and Sealed this

Third Day of March, 2009

JOHN DOLL
*Acting Director of the United States Patent and Trademark Office*